United States Patent [19]

Terashima

[11] Patent Number: 5,164,804
[45] Date of Patent: Nov. 17, 1992

[54] SEMICONDUCTOR DEVICE HAVING HIGH BREAKDOWN VOLTAGE AND LOW RESISTANCE AND METHOD OF FABRICATING THE SAME

[75] Inventor: Tomohide Terashima, Fukuoka, Japan

[73] Assignee: Mitsubishi Denki Kabushiki Kaisha, Tokyo, Japan

[21] Appl. No.: 747,016

[22] Filed: Aug. 19, 1991

[30] Foreign Application Priority Data

Sep. 18, 1990 [JP] Japan .................. 2-250482

[51] Int. Cl.$^5$ .............................. H01L 29/78
[52] U.S. Cl. ................... 257/487; 257/927; 437/90
[58] Field of Search ............... 357/23.4, 23.3

[56] References Cited

U.S. PATENT DOCUMENTS 4,910,563 3/1990 Tuska et al. ............... 357/23.4

FOREIGN PATENT DOCUMENTS 6484733 3/1989 Japan .

Primary Examiner—John D. Lee
Assistant Examiner—Robert E. Wise
Attorney, Agent, or Firm—Oblon, Spivak, McClelland, Maier & Neustadt

[57] ABSTRACT

A P+layer (3) and an N+layer (1) are provided on the top and bottom surfaces of an N−layer (21), respectively. An electrode (7) is formed on the P+layer (3), while an electrode (8) is formed on the bottom surface of the N+layer (1). In a direction from the electrode (7) to the electrode (8), the area of the cross section of the N−layer (21) is decreased, which cross section is perpendicular to the direction. An N−−layer (22) is formed complementarily to the N−layer (21) which is decreased in cross-sectional area. When a potential applied to the electrode (8) is higher than a potential applied to the electrode (7), a depletion layer extends from a PN junction formed by the P+layer (3) and the N−layer (21). Since the impurity concentration of the N−layer (21) is lower than that of the P+layer (3), the depletion layer extends substantially to the N−layer (21). The depletion layer extending to the N−layer (21) substantially holds the voltage applied across the electrodes (7) and (8). In order to improve a breakdown voltage, the cross-sectional area of the N−layer (21) is preferably decreased exponentially. A field intensity in the depletion layer extending within the N−layer (21) hardly depends on a distance from the electrode (7) or (8).

21 Claims, 13 Drawing Sheets

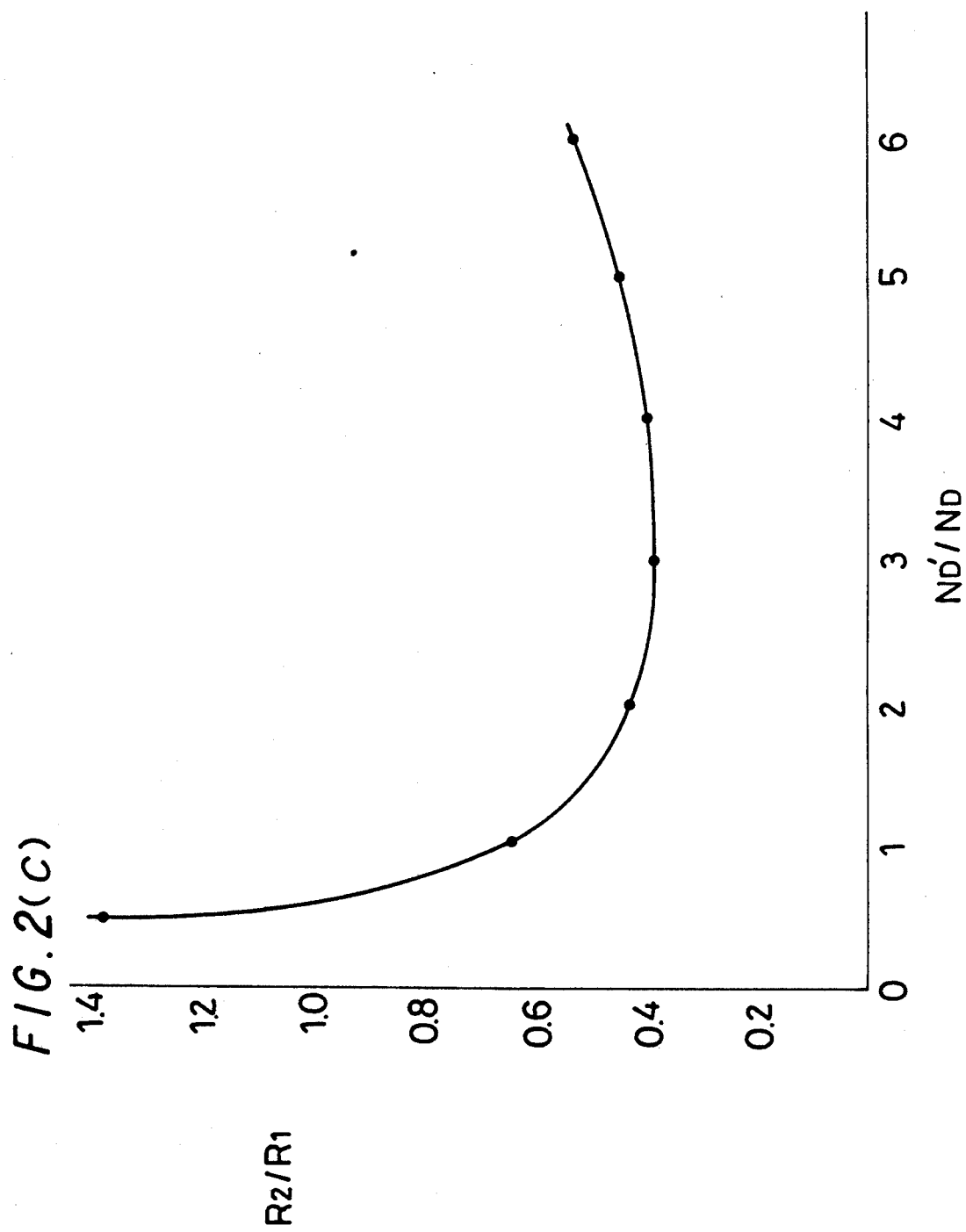

SEMICONDUCTOR DEVICE HAVING HIGH BREAKDOWN VOLTAGE AND LOW RESISTANCE AND METHOD OF FABRICATING THE SAME

BACKGROUND OF THE INVENTION

1. Field of the Invention

The present invention relates to a semiconductor device which holds a high breakdown voltage when it is off and has a low resistance when it is on, and to a method of fabricating the same.

2. Description of the Background Art

FIG. 8 is a sectional view of a conventional diode having a PN junction. An $N^-$ epitaxial layer 2 is formed on an $N^+$ substrate 1. A $P^+$ layer 3 is formed on the $N^-$ epitaxial layer 2, for example, by ion implantation of boron. The $N^+$ substrate 1 and the $P^+$ layer 3 are provided with electrodes 8 and 7, respectively.

When voltage is applied to the diode having such a structure in the forward direction, that is, when a high potential is applied to the $P^+$ layer 3 through the electrode 7 and a low potential is applied to the $N^+$ substrate 1 through the electrode 8, the PN junction formed by the $P^+$ layer 3 and the $N^-$ layer 2 is forward-biased and conducts.

When a low potential is applied to the $P^+$ layer 3 and a high potential is applied to the $N^+$ substrate 1, the PN junction is reverse-biased and a depletion layer extends. The depletion layer holds the applied voltage. The depletion layer hardly extends to the $P^+$ layer 3 but to the $N^-$ layer 2 because of a difference in impurity concentration between the $P^+$ layer 3 and the $N^-$ layer 2. The voltage capable of being held by the depletion layer is a breakdown voltage at the time that a reverse biased voltage is applied. In many cases, the diode is used in the state where the $N^-$ layer 2 is completely depleted, which state specifies a maximum breakdown voltage. This is because the undepleted $N^-$ layer 2 acts only as a resistor when it is biased in the forward direction and causes increase in resistance. As the impurity concentration of the $N^-$ layer 2 grows lower or as the thickness thereof grows larger, the breakdown voltage is increased.

For this reason, increase in the thickness of the $N^-$ layer 2 and decrease in the impurity concentration thereof are required in order to improve the breakdown voltage. However, there has been a problem that this accordingly provides increase in resistance at the time that the voltage is applied in the forward direction (hereinafter referred to as an "ON resistance").

Not only diodes but also transistors have such a problem.

FIG. 9 is a sectional view of a conventional VDMOS transistor. An $N^-$ epitaxial layer 2 is formed on an $N^+$ substrate 1. P well regions 3 are formed by ion implantation of boron and the like. $N^+$ source regions 4 are formed by ion implantation of arsenic and the like. On the $N^-$ layer 2 are provided gate oxide films 12, passivation films 5, gate electrodes 6 and a source electrode 7, in order. A drain electrode 8 is formed on the bottom surface of the $N^+$ substrate 1.

The VDMOS having such a structure is an N channel type. When a low potential is applied to the source electrode 7 and the gate electrodes 6 and a high potential is applied to the drain electrode 8, no N-inversion occurs in the surfaces of the well regions 3 just under the gate electrodes 6. Similarly to the diode, the depletion layer extends from a PN junction formed by the well regions 3 and the $N^-$ layer 2 to the inside of the $N^-$ layer 2. Normally, the breakdown voltage is held, with the depletion layer extending through to the $N^+$ substrate 1 (in an OFF-state). The depletion layer is formed practically within the $N^-$ layer 2 because of a difference in impurity concentration between the well regions 3 and the $N^-$ layer 2.

In this state, when a high potential is applied to the gate electrodes 6, the N-inversion occurs in the surfaces of the well regions 3 just under the gate electrodes 6. Electrons flow through the N-inverted portions of the well regions 3 to the $N^+$ substrate 1, so that the VDMOS transistor is turned on.

The maximum breakdown voltage depends on the impurity concentrations and thicknesses of the $N^+$ substrate 1, the $N^-$ layer 2 and the well regions 3. As the $N^-$ layer 2 in which the extending depletion layer holds the breakdown voltage is thicker and has a lower impurity concentration, the breakdown voltage is increased. The ON resistance mainly depends on the resistance of the N-inverted portions of the well regions 3 (hereinafter referred to as a "channel resistance"), a JFET resistance between the adjacent well regions 3 and the resistance of the $N^-$ layer 2. The channel resistance and the JFET resistance can be improved by processing technique, for example, by the formation of the thin well regions 3. The higher the impurity concentration of the $N^-$ layer 2 is, the smaller the resistance thereof is. The thicker the $N^-$ layer 2 is, the larger the resistance thereof is. In general, the resistance of the $N^-$ layer 2 accounts for the half of the whole resistance or more. The breakdown voltage and the ON resistance are in trade-off relation to each other.

Hence, there has been a problem that improvement in breakdown voltage is incompatible with reduction in ON resistance.

SUMMARY OF THE INVENTION

The present invention is directed to a semiconductor device having a high breakdown voltage and a low resistance. According to the present invention, the semiconductor device comprises a first conductivity type first semiconductor layer having first and second major surfaces; a first conductivity type second semiconductor layer formed on the first major surface of the first semiconductor layer, the impurity concentration of the second semiconductor layer being higher than that of the first semiconductor layer; and a second conductivity type third semiconductor layer formed on the second major surface of the first semiconductor layer, wherein the impurity concentrations and thicknesses of the first and third semiconductor layers are selected such that electric field in a depletion layer extending from a PN junction formed by the first and third semiconductor layers in a breakdown voltage holding state is present substantially within the first semiconductor layer and such that the depletion layer extends through to the second semiconductor layer, and wherein the total cross-sectional area of the first semiconductor layer is decreased in a direction from the PN junction to the second semiconductor layer, the cross section of the first semiconductor layer being perpendicular to the direction.

In another aspect of the present invention, the semiconductor device having a high breakdown voltage and a low resistance comprises a first conductivity type first semiconductor layer having first and second major surfaces; a first conductivity type second semiconductor layer formed on the first major surface of the first semiconductor layer, the impurity concentration of the second semiconductor layer being higher than that of the first semiconductor layer; and a metal layer formed on the second major surface of the first semiconductor layer, wherein the impurity concentration and thickness of the first semiconductor layer are selected such that electric field in a depletion layer extending from a Schottky contact between the first semiconductor layer and the metal layer in a breakdown voltage holding state is present substantially within the first semiconductor layer and such that the depletion layer extends through to the second semiconductor layer, and wherein the total cross-sectional area of the first semiconductor layer is decreased in a direction from the Schottky contact to the second semiconductor layer, the cross section of the first semiconductor layer being perpendicular to the direction.

The present invention is also directed to a method of fabricating a semiconductor device having a high breakdown voltage and a low resistance. According to the present invention, the method comprises the steps of (a) forming a first epitaxial layer on a first conductivity type semiconductor substrate, the impurity concentration of said semiconductor substrate being higher than that of said first epitaxial layer; (b) selectively removing said first epitaxial layer to define the configuration of said first epitaxial layer such that the total cross-sectional area of said first epitaxial layer is decreased in a direction away from said semiconductor substrate, the cross section of said first epitaxial layer being perpendicular to a thickness direction of said first epitaxial layer; (c) filling a concave portion formed by said first epitaxial layer and said semiconductor substrate with a first conductivity type second epitaxial layer, the impurity concentration of the second epitaxial layer being higher than that of said first epitaxial layer and lower than that of said semiconductor substrate; (d) providing a second conductivity type first diffusion layer on said first epitaxial layer; (e) forming an insulative film on said second epitaxial layer; (f) forming a first electrode above said second epitaxial layer on said insulative film; (g) extending said first diffusion layer to a position under said first electrode on said second epitaxial layer; (h) selectively forming a first conductivity type second diffusion layer in the surface of said first diffusion layer so that said first diffusion layer remains disposed under said first electrode; and (i) forming a second electrode in electrical contact with said first and second diffusion layers and a third electrode in electrical contact with said semiconductor substrate, respectively.

In another aspect of the present invention, the method of fabricating a semiconductor device having a high breakdown voltage and a low resistance, comprises the steps of (a) selectively removing a first conductivity type first semiconductor layer having first and second major surfaces on the first major surface to form a concave portion of the first semiconductor layer such that the total cross-sectional area of the first semiconductor layer is decreased in a direction from the second major surface to the first major surface, the cross section of the first semiconductor layer being perpendicular to a thickness direction of the first semiconductor layer; (b) bonding a first conductivity type second semiconductor layer to the first semiconductor layer on the first major surface, the impurity concentration of the second semiconductor layer being higher than that of the first semiconductor layer; (c) forming a second conductivity type third semiconductor layer in the vicinity of the top of the concave portion; (d) forming a first electrode above the second major surface of the first semiconductor layer through an insulative layer; (e) extending the third semiconductor layer to a position under the first electrode on the first semiconductor layer; (f) selectively forming a first conductivity type fourth semiconductor layer in the surface of the third semiconductor layer so that the third semiconductor layer remains disposed under the first electrode; and (g) forming a second electrode in electrical contact with the third and fourth semiconductor layers and a third electrode in electrical contact with the second semiconductor layer, respectively.

In the present invention, the electric field in the depletion layer formed by the PN junction composed of the first conductivity type first semiconductor layer and the second conductivity type third semiconductor layer or by the Schottky contact between the first conductivity type first semiconductor layer and the metal layer, is present substantially within the first semiconductor layer. The depletion layer extends through to the second semiconductor layer. The cross-sectional area of the first semiconductor layer is decreased in the direction away from the PN junction or the Schottky contact. Compared with the conventional semiconductor device wherein the cross-sectional area of the first semiconductor layer is not decreased, the fluctuation of the electric field is small, so that the breakdown voltage is improved.

Therefore, the thickness of the first semiconductor layer required for a predetermined breakdown voltage is small, and the ON resistance is decreased. The trade-off relation between the breakdown voltage and the ON resistance can be improved.

An object of the present invention is to provide a semiconductor device capable of improving trade-off relation between a breakdown voltage and an ON resistance, to thereby hold a high breakdown voltage when it is off and have a low resistance when it is on, and a method of fabricating the same.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2(c) is a graph showing relation between $R_2/R_1$ and $N_D'/N_D$;

DESCRIPTION OF THE PREFERRED EMBODIMENTS

Figure 1A:
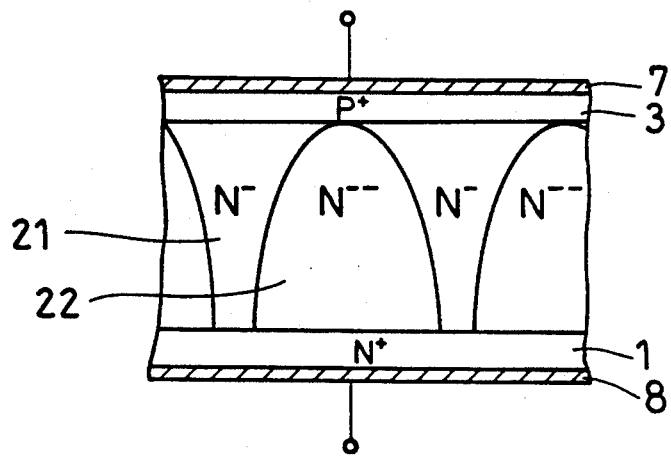
FIGS. 1(a) to 1(c) are sectional views of PN junction diodes according to the present invention.
Figure 1B:
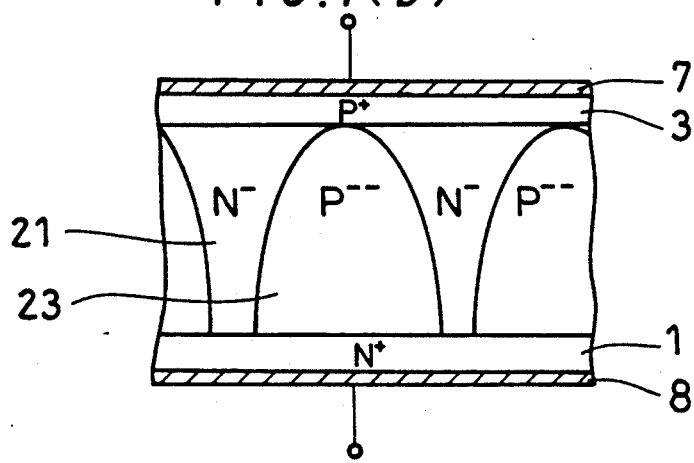
Figure 1C:
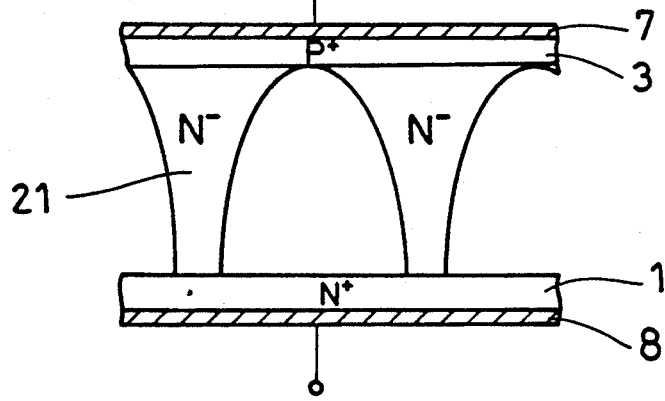

FIGS. 1(a) to 1(c) are sectional views of diodes according to a preferred embodiment of the present invention. The diode of FIG. 1(a) has a PN junction similarly to the conventional diode of FIG. 8. However, an N⁻ layer 21 is decreased in cross-sectional area in a direction from the PN junction to an N+ substrate 1. Vacant spaces formed by the reduction of the N⁻ layer 21 in cross-sectional area are filled with N⁻⁻ layers 22.

In the diode having such a structure, when a low potential is applied to an electrode 7 and a high potential is applied to an electrode 8, a depletion layer extends from the PN junction formed by a P+ layer 3 and the N⁻ layer 21 through the N⁻ layer 21, in accordance with increase in applied voltage, to the N+ substrate 1. The N⁻⁻ layers 22 are completely depleted because of their sufficiently low impurity concentration at this time. It is considered that little electric field is present in the N⁻⁻ layers 22. The configuration of the electric field in the depletion layer grows similar to the configuration of the N⁻ layer 21. Since the P+ layer 3 has a high impurity concentration, the depletion layer hardly extends to the P+ layer 3.

Figure 8:
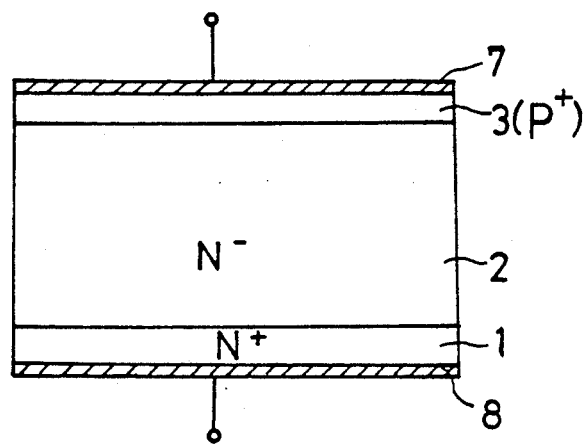
FIG. 8 is a sectional view of a conventional PN junction diode.

The trade-off relation between a breakdown voltage and an ON resistance in this diode is described hereinafter in detail, compared with the relation in the conventional diode of FIG. 8.

Figure 2B:
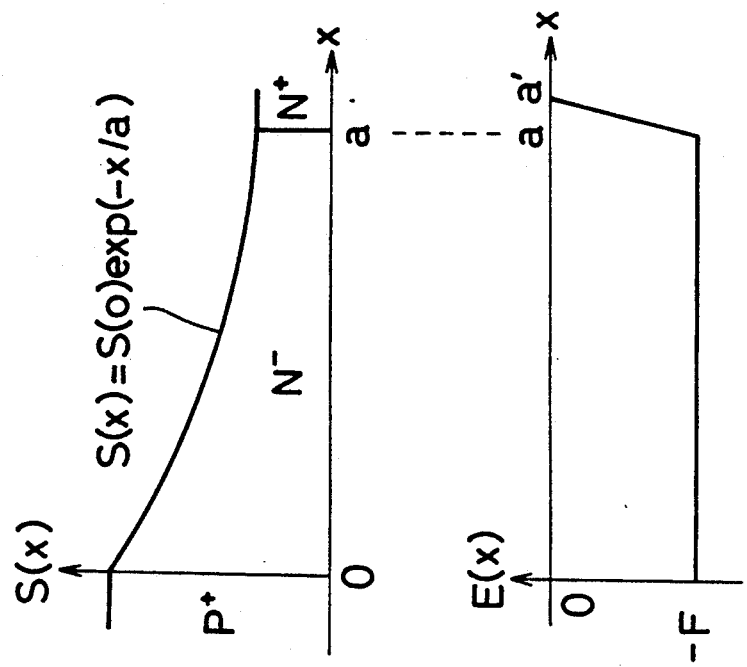
FIGS. 2(a) and 2(b) are conceptual views of electric field in a depletion layer.
Figure 2A:
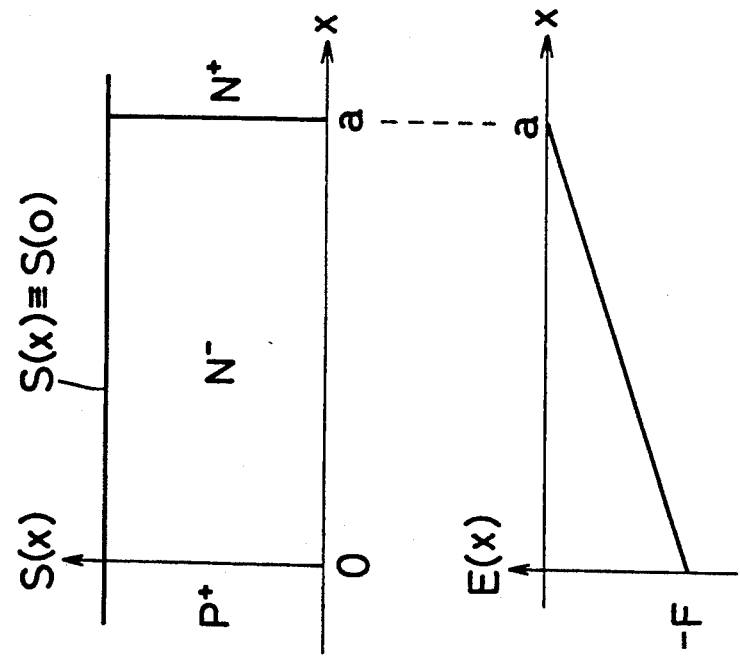

FIG. 2(a) and FIG. 2(b) show electric fields at the time that a reverse-biased voltage is applied to the diodes of FIG. 8 and FIGS. 1(a) to 1(c), respectively. A direction from the P+ layer 3 to the N+ substrate is taken as positive in the positional coordinate x. The position of the PN junction is taken as origin.

In the conventional diode, the cross-sectional area $S(x)$ of the N⁻ layer 2 does not depend on x, and constantly $S(x) \equiv S(0)$. From the expression of Poisson, the following equation is provided:

$$d^2V/dx^2 = -C \tag{1}$$

where
V is a voltage and
$$C \equiv qN_D/\epsilon \tag{2}$$

q: charge amount of electrons
$N_D$: impurity concentration of N⁻ layer 2
$\epsilon$: dielectric constant of N⁻ layer 2

Based on the higher potential, that is, the potential of the N+ substrate 1, the x coordinate at this position or the thickness of the N⁻ layer 2 is taken as a. Accordingly, the following boundary conditions hold:

$$(-dy/dx)_{x=a} = 0 \tag{3}$$

$$V(a) = 0 \tag{4}$$

The equation (1) is solved by using the boundary conditions (3) and (4), and thereby the voltage of the N+ substrate 1 having the higher potential, that is, the breakdown voltage where the depletion layer extends throughout the N⁻ layer 2 is as follows:

$$|V(0)| = a^2 C/2 \tag{5}$$

Field intensity in the PN junction (or the maximum electric field by which avalanche breakdown does not occur) is as follows:

$$F = |(-dV/dx)_{x=0}| = Ca \tag{6}$$

The ON resistance is expressed as:

$$R_1 = Ka/S(0) \tag{7}$$

where K is a proportionality constant inherent in the material of the N⁻ layer 2.

The diode of FIG. 1(a) according to the present invention is considered below in which the cross-sectional area of the N⁻ layer 21 is exponentially decreased with the increase of x as shown in FIG. 2(b). The cross-sectional area is assumed to be expressed as:

$$S(X) = S(0) \exp(-x/a) \tag{8}$$

The electric field is found in the same manner as the conventional diode. Using the following expression:

$$dS(x)/dx = -S(x)/a \tag{9}$$

and noting that the boundary condition:

$$(-dV/dx)_{x=0} = -F \tag{10}$$

i.e., the field intensity in the PN junction is equal to that of the conventional diode, the electric field is as follows:

$$(-dV/dx) = -F \text{ (constant)} \tag{11}$$

It is found that the electric field in the depletion layer is constant, independent of the position x. Although the electric field is decreased only in a small region (between a and a' in FIG. 2(b)) in the N+ substrate 1, it may be supposed that a' is equal to a because the impurity concentration in the N+ substrate 1 is high.

The breakdown voltage is:

$$|V(0)| = Fa \tag{12}$$

which is equal to $a^2C$ from the expression (6). The breakdown voltage of the present invention is twice as high as that of the prior art represented by the expression (5). Since the electric field in the N⁻ layer 21 is constant in the present invention, the same breakdown voltage as the prior art can be provided with the half thickness of the N⁻ layer 2 of the conventional diode.

With the same breakdown voltage, that is with the half thickness (a/2) of the N⁻ layer 21 in this preferred embodiment (without change in the function form of $S(x)$), the resistance is as follows:

$$R_2 = K \int_0^{a/2} [1/S(x)]dx \tag{13}$$
$$= [\exp(1/2) - 1]Ka/S(0)$$

Compared with the expression (7), the resistance is reduced to about 0.6 times it is found that the trade-off relation between the breakdown voltage and the ON resistance can be improved.

The exponential decrease in the cross-sectional area of the N⁻ layer 21 toward the N+ substrate 1 is discussed hereinabove. As far as the cross-sectional area of the N⁻ layer 21 is decreased even in a manner other than exponential, similar effects can be provided. For example, the N⁻ layer 21 may be pyramidical, hemispherical or hemicylindrical.

The proportionality constant K indicated in the expression (7) is approximately inversely proportional to the impurity concentration $N_D$. Assuming that the impurity concentration is different between the prior art and the present invention, the following expressions are obtained:

$$R_2/R_1 \approx (C^2/C'^2)[\exp(C'/2C)-1] \quad (14)$$

$$C' \approx qN_D'/\epsilon \quad (15)$$

$N_D'$: impurity concentration of N⁻ layer 21 where the dielectric constant of the N⁻ layer 21 in the present invention is equal to that of the N⁻ layer 2 in the prior art.

FIG. 2(c) shows relation between $R_2/R_1$ and $N_D'/N_D$. As is recognized from FIG. 2(c), when the thickness of the N⁻ layer 21 is one half of the thickness of the N⁻ layer 2, $R_2/R_1$ is optimally improved, i.e., $R_2/R_1 \approx 0.4$, at $N_D'/N_D \approx 3$. The resistance can be reduced to half with the same breakdown voltage.

The N⁻⁻ layers 22 disposed complementarily to the N⁻ layer 21 between the P⁺ layer 3 and the N⁺ substrate 1 may be replaced with P⁻⁻ layers 23 as shown in FIG. 1(b). When the portions where the N⁻⁻ layers 22 are present are not filled with semiconductor material, similar effects can be provided.

Figure 3A:
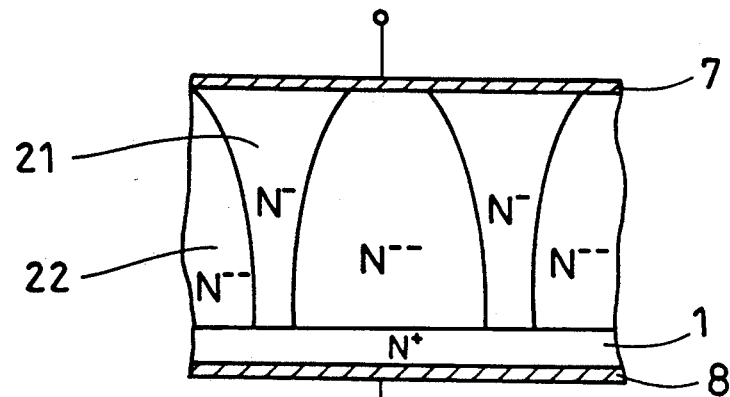
FIGS. 3(a) to 3(c) are sectional views of Schottky diodes according to the present invention.
Figure 3B:
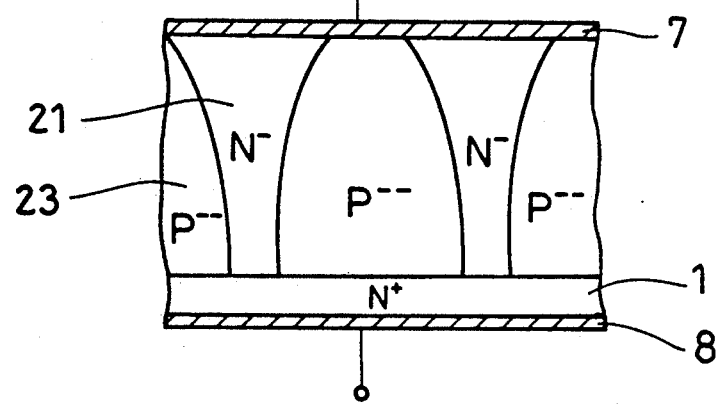
Figure 3C:
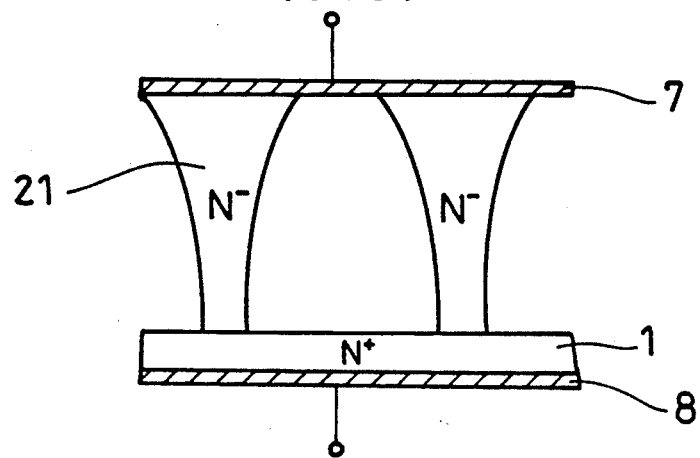

A diode in which the metal electrode 7 and the N⁻ layer 21 are in Schottky contact with each other without the P⁺ layer 3 can provide the similar effects. As shown in FIGS. 3(a) to 3(c), diodes in which the cross-sectional area of the N⁻ layer 21 is decreased toward the N⁺ substrate 1 can provide the similar effects. FIG. 3(a) shows a diode in which the portions other than the N⁻ layer 21 between the metal electrode 7 and the N⁺ substrate 1 are filled with the N⁻⁻ layers 22. FIG. 3(b) shows a diode in which the portions are filled with the P⁻⁻ layers 23. FIG. 3(c) shows a diode in which the portions are not filled with semiconductor material.

A method of fabricating a semiconductor device in which the cross-sectional area of the N⁻ layer 21 is decreased toward the N⁺ substrate 1 will be described in detail in the following preferred embodiment.

FIGS. 4(a) to 4(g) are sectional views of a VDMOS transistor in various stages of fabrication according to the present invention. The description of the operation will follow the description of the steps of fabrication.

Figure 4A:
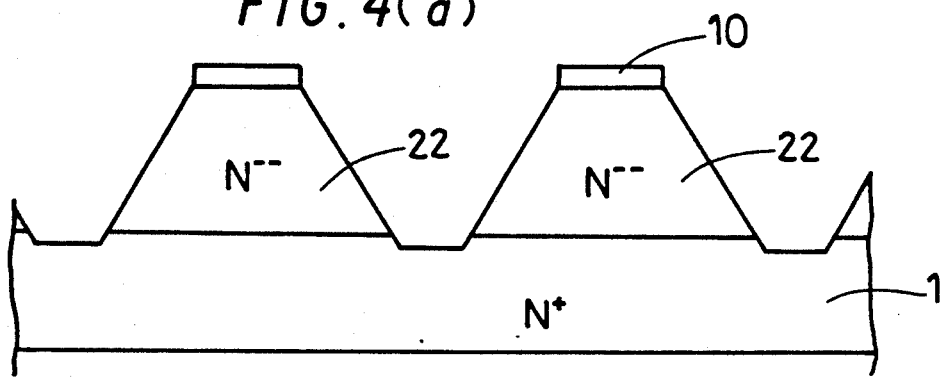
FIGS. 4(a) to 4(g) and 5(a) to 5(g) are sectional views of VDMOS diodes in various stages of fabrication according to the present invention, respectively.

With reference to FIG. 4(a), the N⁻⁻ epitaxial layer 22 is formed on the N⁺ substrate 1 of silicon. Masked with patterned nitride films 10 disposed on the N⁻⁻ layer 22, the N⁻⁻ layer 22 is wet etched. An etching configuration varies depending on the ingredients of an etchant. In the preferred embodiment of FIGS. 4(a) to 4(g), an anisotropic etching using an etchant including KOH or NaOH is described.

Figure 4B:
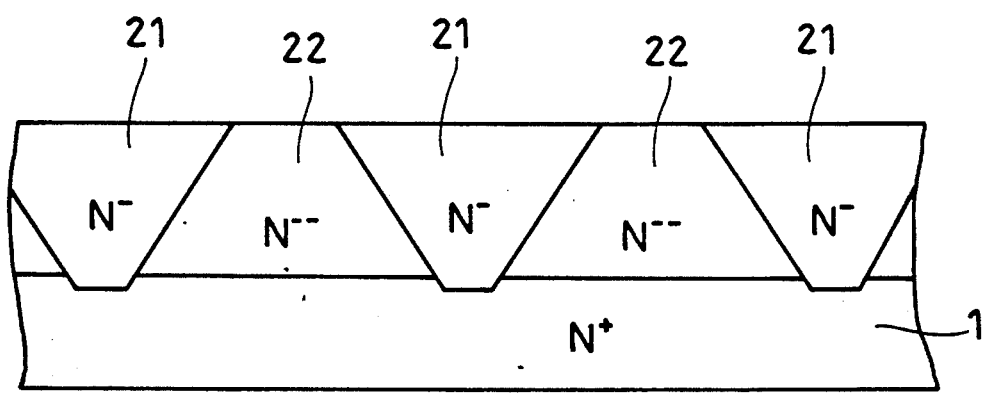

As shown in FIG. 4(b), the nitride films are removed, and the N⁻ epitaxial layers 21 are provided in the etched-off portions.

Figure 4C:
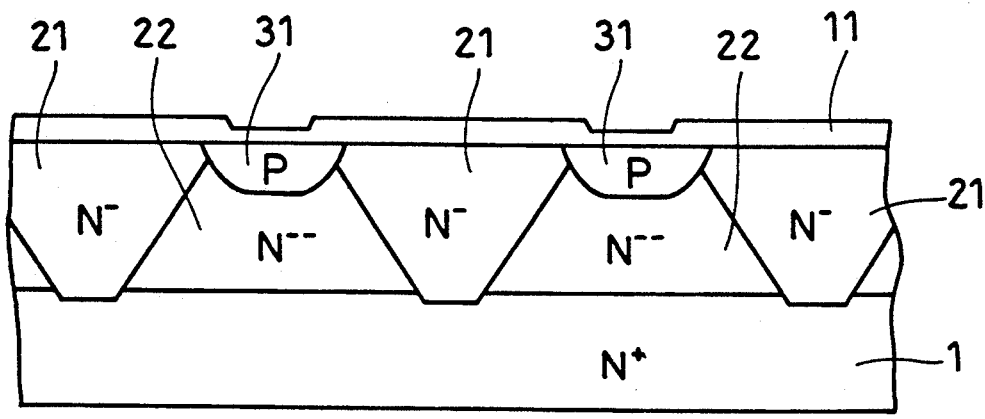

A thermal oxide film 11 is formed and patterned by using a photoresist not shown. Oxidation before ion implantation and, subsequently, ion implantation of boron are performed. After the photoresist is removed, diffusion is carried out by annealing to form P layers 31, as shown in FIG. 4(c).

Figure 4D:
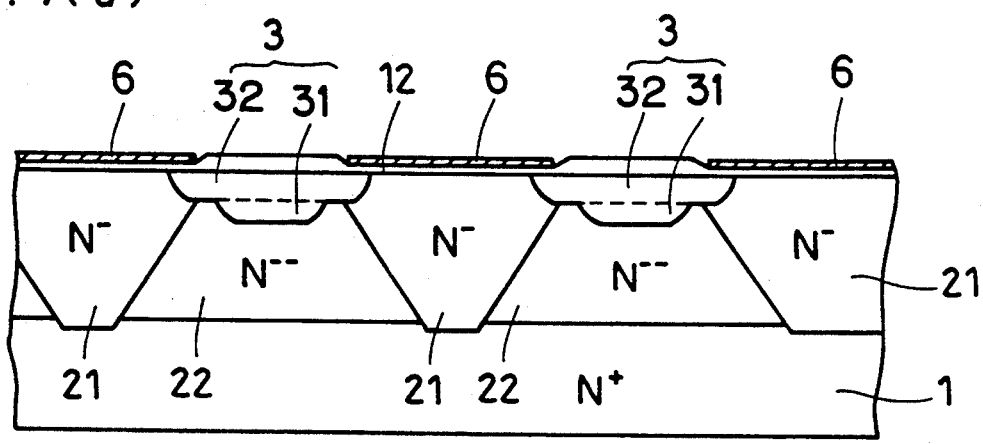
Figure 4E:
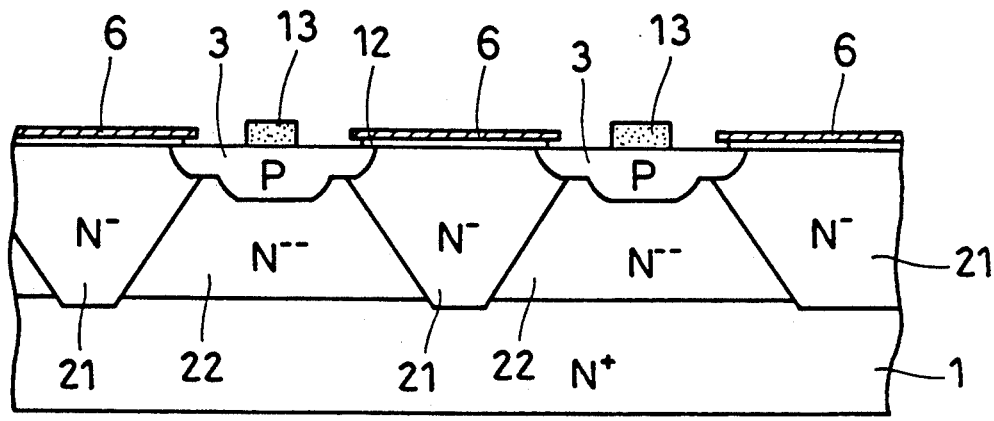
Figure 4F:
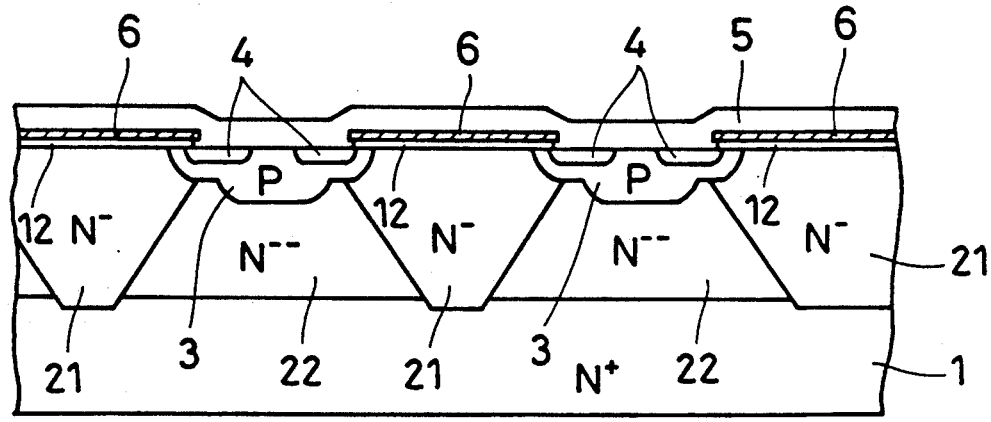
Figure 4G:
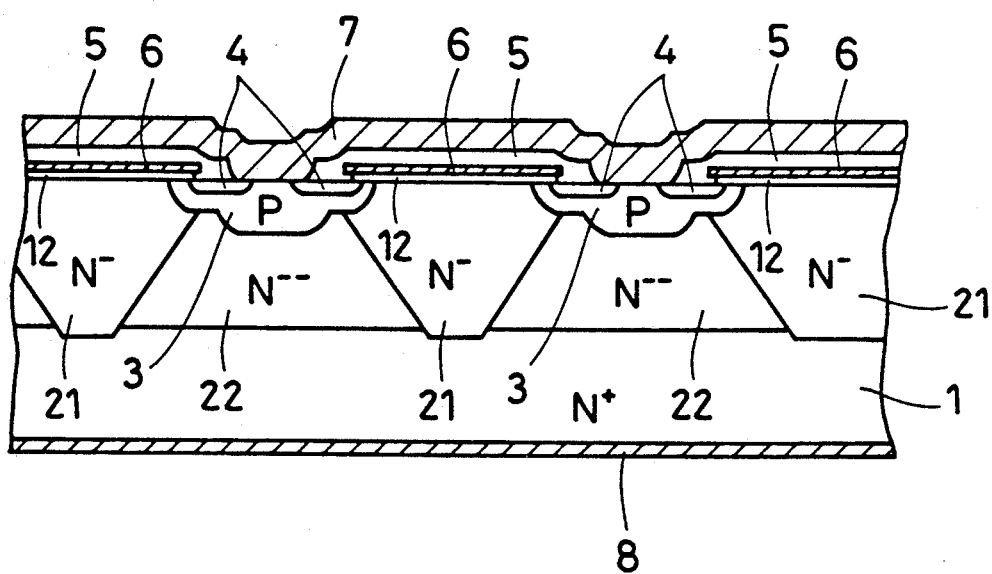

The oxide film 11 is entirely removed, and a gate oxide film 12 is formed. Polysilicons 6 serving as gate electrodes are formed on the gate oxide film 12 and subsequently patterned. Ion implantation of boron is again performed. Diffusion is carried out by annealing to form P layers 32. The P layers 31 and 32 form the P layers 3, as shown in FIG. 4(d). oxide films formed in annealing on the P layers 3 are removed. Using patterned photoresists 13 and the polysilicons 6 as a mask, ion implantation of arsenic is performed, as shown in FIG. 4(e). After the photoresists 13 are removed, N⁺ layers 4 are formed by annealing. A PSG 5, for example, is formed as a passivation film, as shown in FIG. 4(f). To expose parts of the P layers 3 and parts of the N⁺ layers 4, the PSG 5 is opened by patterning right above these parts. A source electrode of Al-Si 7 is formed by sputtering. The back electrode 8 serving as a drain electrode is formed on the bottom surface of the N⁺ substrate 1 by evaporation, as shown in FIG. 4(g).

Figure 9:
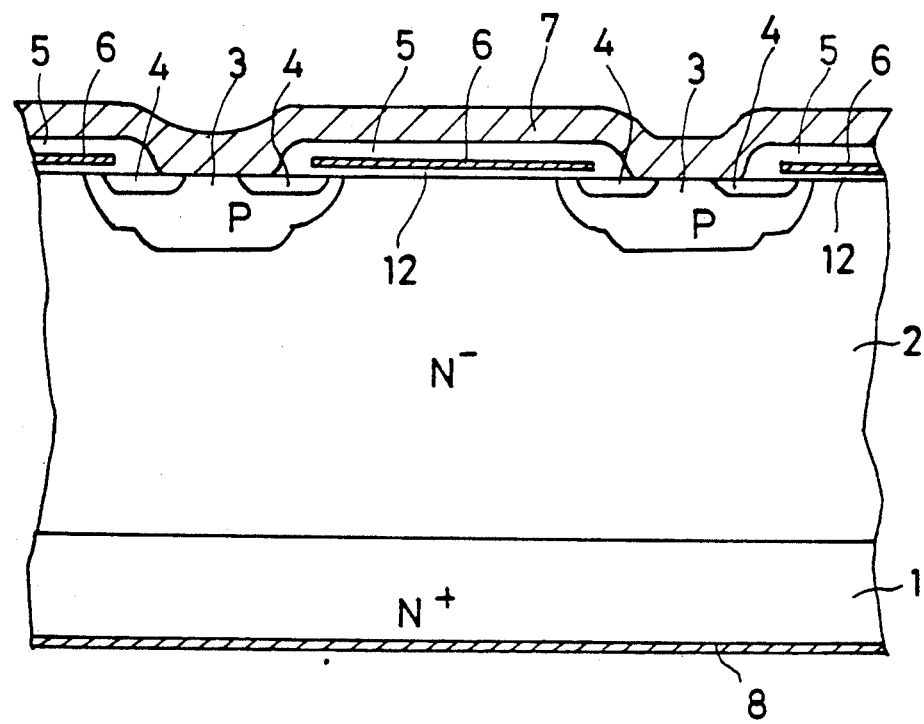
FIG. 9 is a sectional view of a conventional VDMOS transistor.

In the VDMOS transistor fabricated in this manner, the cross-sectional area of the N⁻ layers 21 is decreased in a direction from the P layers 3 to the N⁺ substrate 1. When a low potential is applied to the source electrode 7 and the gate electrodes 6 and a high potential is applied to the drain electrode 8, that is, when the VDMOS transistor is off, the same breakdown voltage as the conventional VDMOS transistor of FIG. 9 can be held by the N⁻ layers 21 which are thinner than the N⁻ layer 2, similarly to the preferred embodiment of the diode of FIG. 1(a). The resistance can be reduced when a high potential is applied to the gate electrodes 6, that is, when the VDMOS transistor is on. Therefore, the trade-off relation between the breakdown voltage and the ON resistance can be improved.

The N⁻ layer 21 need not be formed by epitaxial growth. The N⁻ layer 21 as a substrate may be bonded to the N⁺ substrate 1. This method is discussed below. FIGS. 5(a) to 5(g) are sectional views of a VDMOS transistor in various stages of another fabrication method according to the present invention.

Figure 5A:
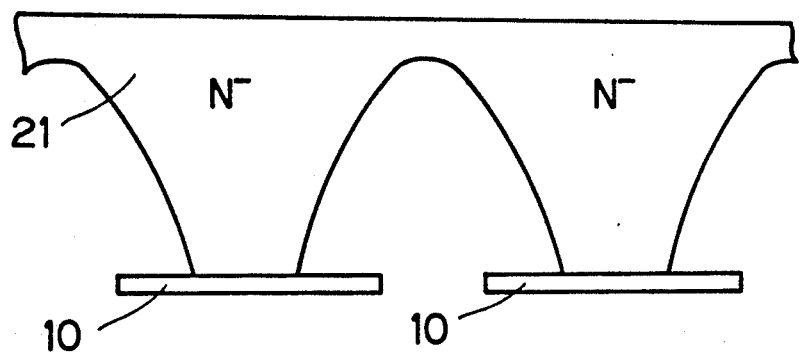

Referring to FIG. 5(a), an N⁻ substrate 21 of silicon is etched, masked with the patterned nitride films 10 provided on the bottom surface of the N⁻ substrate 21. As described with reference to FIGS. 4(a) to 4(g), the etching configuration varies depending on the ingredients of the etchant, and is arbitrary such as a hemisphere and a pyramid. An etching in the form of a curved surface is shown in FIGS. 5(a) to 5(g).

Figure 5B:
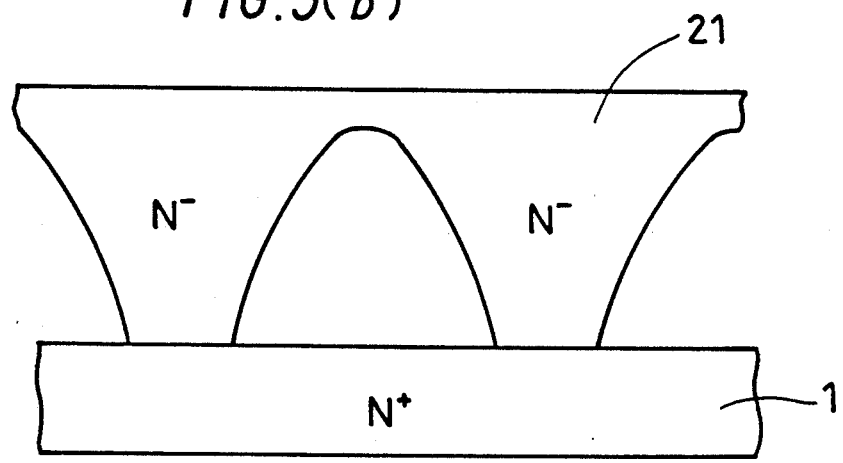
Figure 5C:
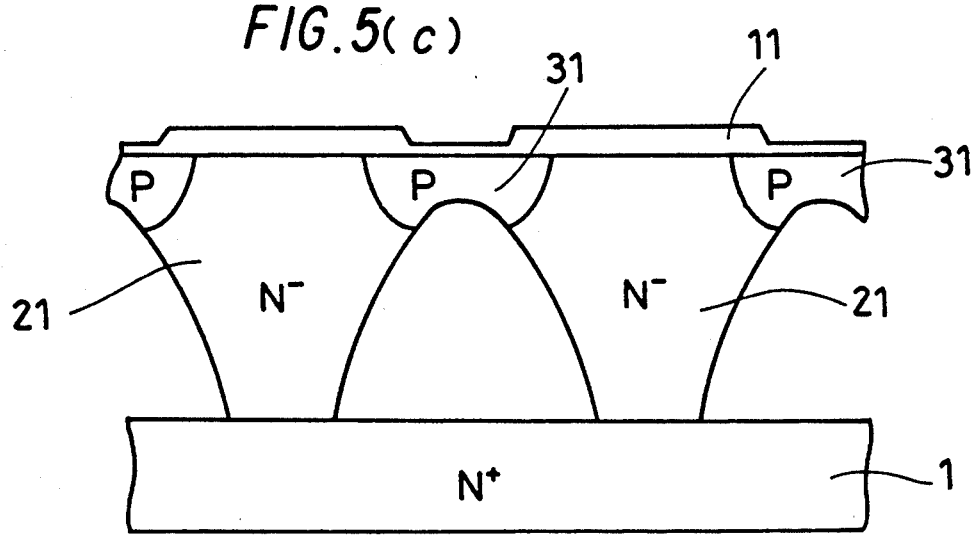
Figure 5D:
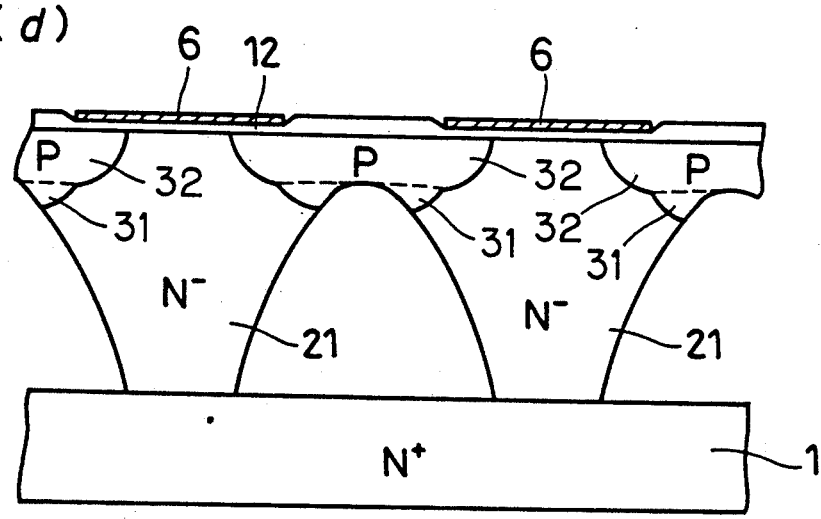
Figure 5E:
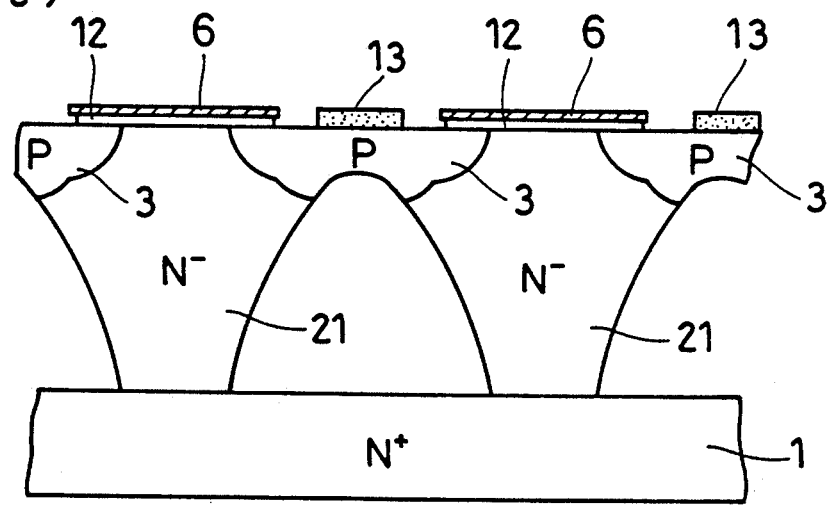
Figure 5F:
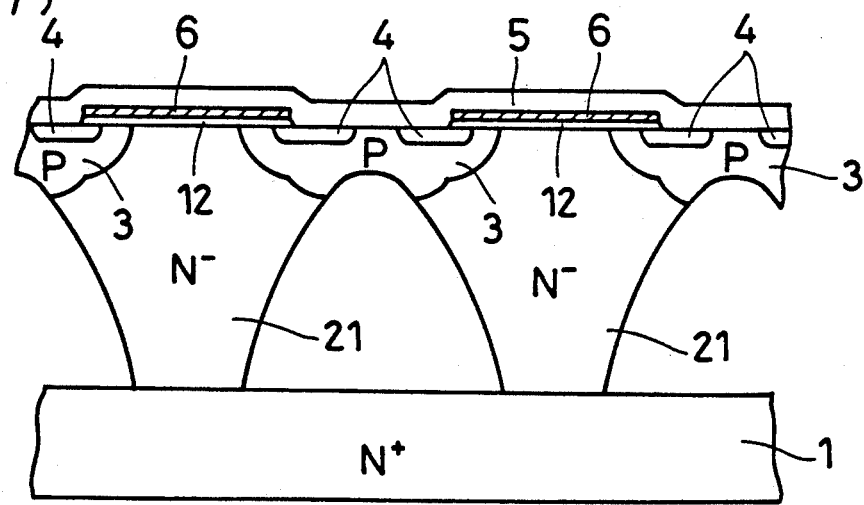
Figure 5G:
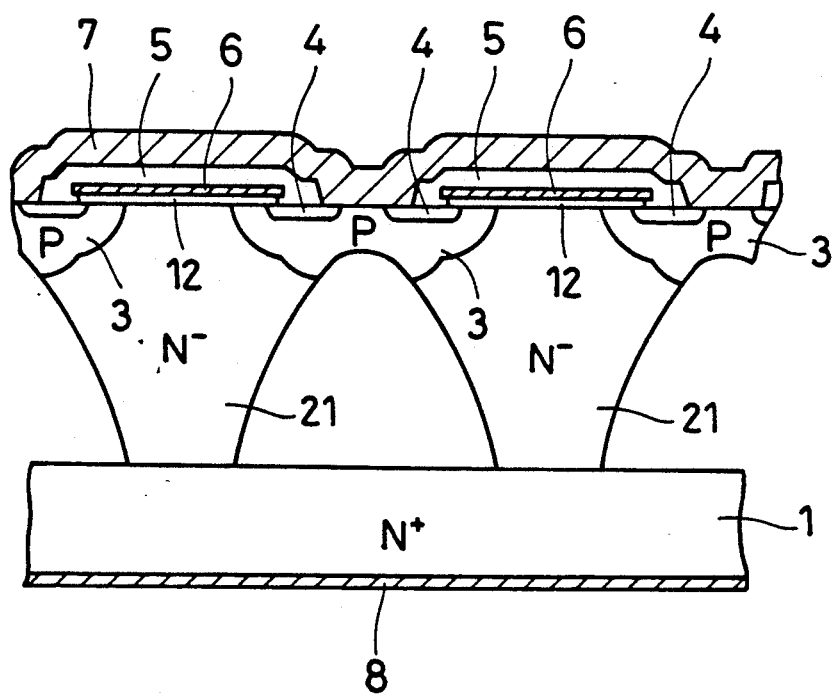

As shown in FIG. 5(b), the etched surfaces of the N⁻ substrate 21 are mirror-polished. The N⁻ substrate 21 is bonded to the N⁺ substrate 1 having a mirror-polished surface in mirror-polished-surface to mirror-polished-surface relation by wafer bonding method. The other surface of the N⁻ substrate 21 is lapped so that the N⁻ substrate 21 is formed in an appropriate thickness.

FIGS. 5(c) to 5(g) correspond to FIGS. 4(c) to 4(g), respectively. The VDMOS transistor is attained in a substantially similar method.

The VDMOS transistor of FIGS. 5(a) to 5(g) is capable of improving the trade off relation between the breakdown voltage and the ON resistance, similarly to the VDMOS transistor of FIGS. 4(a) to 4(g).

The present invention is applicable to other devices which are required to hold a high breakdown voltage when it is off and to have a low resistance when it is on, in addition to the VDMOS transistors.

Figure 6:
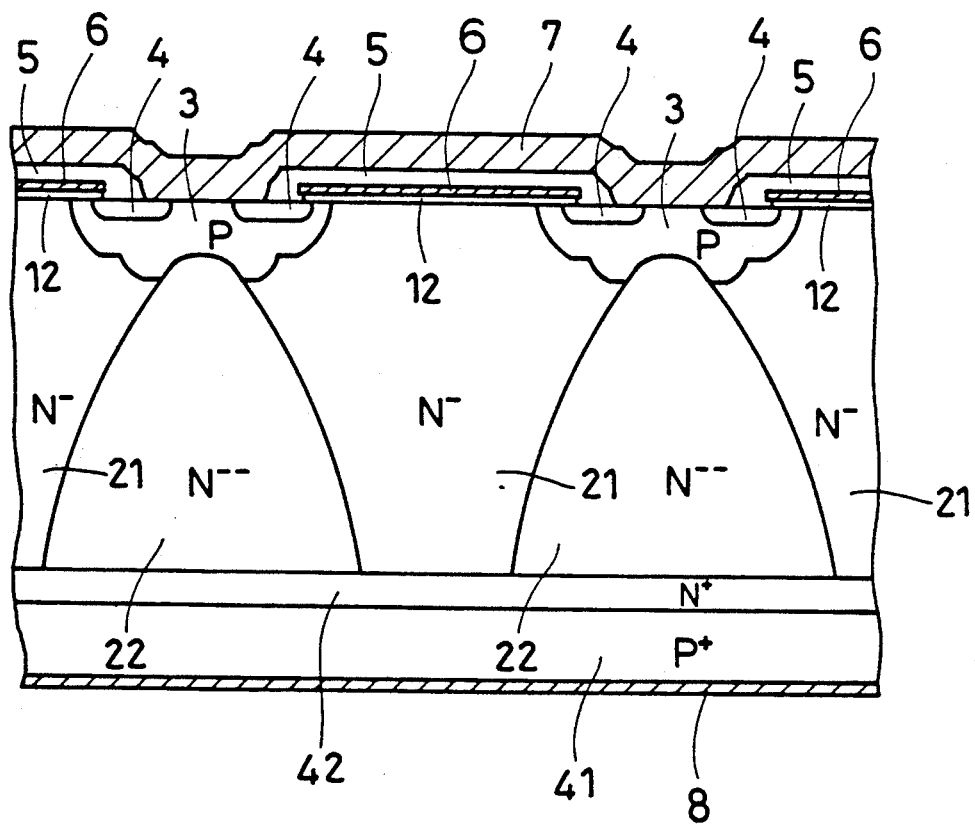
FIG. 6 is a sectional view of an IGBT according to the present invention.

FIG. 6 is a sectional view of an insulated gate bipolar transistor (hereinafter referred to as an "IGBT") according to the present invention. An N⁺ layer 42 is formed on a P+ substrate 41. The N− layer 21 is formed on the N+ layer 42. The P well regions 3 are formed in the surface of the N− layer 21. The N+ emitter regions 4 are formed in the surfaces of the well regions 3. The gate electrodes 6 are formed above the N− layer 21 through the gate oxide films 12 and insulated from the emitter electrode 7 by the passivation films 5. The emitter electrode 7 is in contact with the well regions 3 and the emitter regions 4. The collector electrode 8 is in contact with the P+ substrate 41. The portions where the N− layer 21 is absent on the N+ layer 42 are filled with semiconductor material having an extremely low impurity concentration, for example, the N−− layers 22.

In the IGBT having such a structure, when a low potential is applied to the gate electrodes 6 and the emitter electrode 7 by short-circuiting them and a high potential is applied to the collector electrode 8, the depletion layer extends from the PN junction formed by the well regions 3 and the N− layer 21. The breakdown voltage is held, with the depletion layer extending through to the N+ layer 42. Also in this preferred embodiment, the breakdown voltage can be improved where the thickness of the N− layer 21 is equal to that of the conventional N− layer 2.

When a high potential is applied to the gate electrodes 6, the N-inversion occurs in the surfaces of the well regions 3 just under the gate electrodes 6. Electrons flow from the emitter regions 4 to the N− layer 21. Holes are directed from the collector electrode 8 to the N− layer 21, so that the IGBT is turned on. With the same breakdown voltage, the ON resistance can be reduced, compared with the IGBT in which the cross-sectional area of the N− layer 21 is not decreased toward the N+ layer 42. The trade-off relation between the breakdown voltage and the ON resistance can be improved.

Figure 7:
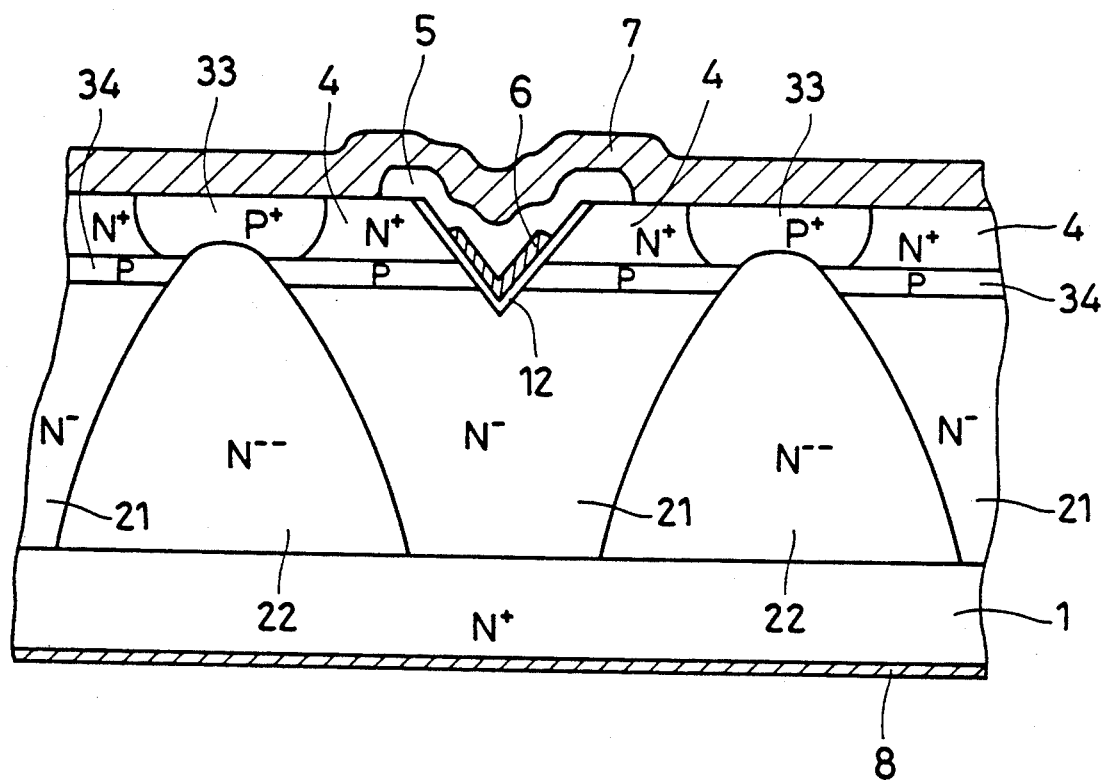
FIG. 7 is a sectional view of a VVMOS transistor according to the present invention.

FIG. 7 is a sectional view of a VVMOS transistor according to the present invention. The N− layer 21 is formed on the N+ substrate 1. A P region 34 is formed on the N− layer 21, and an N+ source region 4 is formed on the P region 34. P+ diffusion regions 33 are formed in contact with the P region 34 and the source region 4. The V-shaped gate electrode 6 and gate oxide film 12 are insulated from the source electrode by the passivation film 5. The source electrode 7 is in contact with the regions 33 and the source region 4. The drain electrode 8 is in contact with the N+ substrate 1. The portions where the N− layer 21 is absent on the N+ substrate 1 are filled with semiconductor material having an extremely low impurity concentration, for example, the N−− layers 22.

In the VVMOS transistor having such a structure, when a low potential is applied to the gate electrode 6 and the source electrode 7 by short-circuiting them and a high potential is applied to the drain electrode 8, the depletion layer extends from the PN junction formed by the P region 34 and the N− layer 21. The breakdown voltage is held, with the depletion layer extending through to the N+ substrate 1.

When a high potential is applied to the gate electrode 6, the N-inversion occurs in the surface of the P region 34 right under the gate electrode 6. Electrons flow from the source region 4 to the N− layer 2, so that the VVMOS transistor is turned on. Also in this preferred embodiment, the trade-off relation between the breakdown voltage and the ON resistance can be improved.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device having a high breakdown voltage and a low resistance, comprising:
   a first conductivity type first semiconductor layer having first and second major surfaces;
   a first conductivity type second semiconductor layer formed on said first major surface of said first semiconductor layer, the impurity concentration of said second semiconductor layer being higher than that of said first semiconductor layer; and
   a second conductivity type third semiconductor layer formed on said second major surface of said first semiconductor layer,
   wherein the impurity concentrations and thicknesses of said first and third semiconductor layers are selected such that electric field in a depletion layer extending from a PN junction formed by said first and third semiconductor layers in a breakdown voltage holding state is present substantially within said first semiconductor layer and such that said depletion layer extends through to said second semiconductor layer, and
   wherein the total cross-sectional area of said first semiconductor layer is decreased in a direction from said PN junction to said second semiconductor layer, the cross section of said first semiconductor layer being perpendicular to said direction.

2. A semiconductor device having a high breakdown voltage and a low resistance as defined in claim 1, wherein the total cross-sectional area of said first semiconductor layer is decreased exponentially in said direction.

3. A semiconductor device having a high breakdown voltage and a low resistance as defined in claim 1, wherein a vacant space formed by said first semiconductor layer is filled with a first conductivity type fourth semiconductor layer, the impurity concentration of the fourth semiconductor layer being lower than that of said first semiconductor layer.

4. A semiconductor device having a high breakdown voltage and a low resistance as defined in claim 1, wherein a vacant space formed by said first semiconductor layer is filled with a second conductivity type fourth semiconductor layer, the impurity concentration of the fourth semiconductor layer being lower than that of said first semiconductor layer.

5. A semiconductor device having a high breakdown voltage and a low resistance as defined in claim 1, wherein said third semiconductor layer is selectively formed on said second major surface.

6. A semiconductor device having a high breakdown voltage and a low resistance as defined in claim 5, further comprising:
   a first conductivity type fourth semiconductor layer selectively formed in the surface of said third semiconductor layer;
   an insulative film formed on a portion of said third semiconductor layer between said first semiconductor layer and said fourth semiconductor layer; and
   a conductive film formed on said insulative film.

7. A semiconductor device having a high breakdown voltage and a low resistance as defined in claim 6, wherein said conductive film is V-shaped.

8. A semiconductor device having a high breakdown voltage and a low resistance as defined in claim 6, further comprising:
a second conductivity type fifth semiconductor layer formed on said second semiconductor layer opposite to said first semiconductor layer.

9. A semiconductor device having a high breakdown voltage and a low resistance, comprising:
a first conductivity type first semiconductor layer having first and second major surfaces;
a first conductivity type second semiconductor layer formed on said first major surface of said first semiconductor layer, the impurity concentration of said second semiconductor layer being higher than that of said first semiconductor layer; and
a metal layer formed on said second major surface of said first semiconductor layer,
wherein the impurity concentration and thickness of said first semiconductor layer are selected such that electric field in a depletion layer extending from a Schottky contact between said first semiconductor layer and said metal layer in a breakdown voltage holding state is present substantially within said first semiconductor layer and such that said depletion layer extends through to said second semiconductor layer, and
wherein the total cross-sectional area of said first semiconductor layer is decreased in a direction from said Schottky contact to said second semiconductor layer, the cross section of said first semiconductor layer being perpendicular to said direction.

10. A semiconductor device having a high breakdown voltage and a low resistance as defined in claim 9, wherein the total cross-sectional area of said first semiconductor layer is decreased exponentially in said direction.

11. A semiconductor device having a high breakdown voltage and a low resistance as defined in claim 9, wherein a vacant space formed by said first semiconductor layer is filled with a first conductivity type third semiconductor layer, the impurity concentration of the third semiconductor layer being lower than that of said first semiconductor layer.

12. A semiconductor device having a high breakdown voltage and a low resistance as defined in claim 9, wherein a vacant space formed by said first semiconductor layer is filled with a second conductivity type third semiconductor layer, the impurity concentration of the third semiconductor layer being lower than that of said first semiconductor layer.

13. A semiconductor device having a high breakdown voltage and a low resistance, comprising:
a first conductivity type first semiconductor layer having first and second major surfaces;
a first conductivity type second semiconductor layer formed on said first major surface of said first semiconductor layer, the impurity concentration of the second semiconductor layer being higher than that of said first semiconductor layer;
a second conductivity type third semiconductor layer formed on said second major surface of said first semiconductor layer;
a first conductivity type fourth semiconductor layer formed on said third semiconductor layer; and
a second conductivity type fifth semiconductor layer selectively formed in said fourth semiconductor layer to be in contact with said third semiconductor layer,
wherein the impurity concentrations and thicknesses of said first and third semiconductor layers are selected such that electric field in a depletion layer extending from a PN junction formed by said first and third semiconductor layers in a breakdown voltage holding state is present substantially within said first semiconductor layer and such that said depletion layer extends through to said second semiconductor layer,
wherein said first, third and fourth semiconductor layers are selectively removed to form a V-shaped portion having an opening in said fourth semiconductor layer and a corner in said first semiconductor layer,
wherein at least said first and third semiconductor layers are selectively removed to form a concave portion having an opening at said first major surface and a top at a position corresponding to said fifth semiconductor layer, and
wherein the total cross-sectional area of said first semiconductor layer is decreased in a direction from said PN junction to said second semiconductor layer, the cross section of said first semiconductor layer being perpendicular to said direction.

14. A semiconductor device having a high breakdown voltage and a low resistance as defined in claim 13, further comprising:
an insulative film formed on the inside of said V-said portion; and
a conductive film formed on said insulative film.

15. A method of fabricating a semiconductor device having a high breakdown voltage and a low resistance, said method comprising the steps of:
(a) forming a first epitaxial layer on a first conductivity type semiconductor substrate, the impurity concentration of said semiconductor substrate being higher than that of said first epitaxial layer;
(b) selectively removing said first epitaxial layer to define the configuration of said first epitaxial layer such that the total cross-sectional area of said first epitaxial layer is decreased in a direction away from said semiconductor substrate, the cross section of said first epitaxial layer being perpendicular to a thickness direction of said first epitaxial layer;
(c) filling a concave portion formed by said first epitaxial layer and said semiconductor substrate with a first conductivity type second epitaxial layer, the impurity concentration of the second epitaxial layer being higher than that of said first epitaxial layer and lower than that of said semiconductor substrate;
(d) providing a second conductivity type first diffusion layer on said first epitaxial layer;
(e) forming an insulative film on said second epitaxial layer;
(f) forming a first electrode above said second epitaxial layer on said insulative film;
(g) extending said first diffusion layer to a position under said first electrode on said second epitaxial layer;
(h) selectively forming a first conductivity type second diffusion layer in the surface of said first diffusion layer so that said first diffusion layer remains disposed under said first electrode; and (i) forming a second electrode in electrical contact with said first and second diffusion layers and a third electrode in electrical contact with said semiconductor substrate, respectively.

16. A method of fabricating a semiconductor device having a high breakdown voltage and a low resistance, said method comprising the steps of:
   (a) selectively removing a first conductivity type first semiconductor layer having first and second major surfaces on said first major surface to form a concave portion of said first semiconductor layer such that the total cross-sectional area of said first semiconductor layer is decreased in a direction from said second major surface to said first major surface, the cross section of said first semiconductor layer being perpendicular to a thickness direction of said first semiconductor layer;
   (b) bonding a first conductivity type second semiconductor layer to said first semiconductor layer on said first major surface, the impurity concentration of the second semiconductor layer being higher than that of said first semiconductor layer;
   (c) forming a second conductivity type third semiconductor layer in the vicinity of the top of said concave portion;
   (d) forming a first electrode above said second major surface of said first semiconductor layer through an insulative layer;
   (e) extending said third semiconductor layer to a position under said first electrode on said first semiconductor layer;
   (f) selectively forming a first conductivity type fourth semiconductor layer in the surface of said third semiconductor layer so that said third semiconductor layer remains disposed under said first electrode; and
   (g) forming a second electrode in electrical contact with said third and fourth semiconductor layers and a third electrode in electrical contact with said second semiconductor layer, respectively.

17. A method of fabricating a semiconductor device having a high breakdown voltage and a low resistance, said method comprising the steps of:
   (a) forming a first conductivity type first semiconductor layer having first and second major surfaces on a first conductivity type second semiconductor layer, the boundary of said first semiconductor layer from said second semiconductor layer being said first major surface, the total cross-sectional area of said first semiconductor layer perpendicular to a direction away from said second semiconductor layer being increased in said direction, the impurity concentration of said second semiconductor layer being higher than that of said first semiconductor layer; and
   (b) forming a second conductivity type third semiconductor layer on said second major surface of said first semiconductor layer, the impurity concentrations and thicknesses of said first and third semiconductor layers are selected such that electric field in a depletion layer extending from a PN junction formed by said first and third semiconductor layers in a breakdown voltage holding state is present substantially within said first semiconductor layer and such that said depletion layer extends through to said second semiconductor layer.

18. A method of fabricating a semiconductor device having a high breakdown voltage and a low resistance as defined in claim 17, wherein said third semiconductor layer is selectively formed on said first surface of said first semiconductor layer.

19. A method of fabricating a semiconductor device having a high breakdown voltage and a low resistance as defined in claim 18, said method further comprising the steps of:
   (d) selectively forming a first conductivity type fourth semiconductor layer in the surface of said third semiconductor layer;
   (e) forming an insulative film on a portion of said third semiconductor layer between said first semiconductor layer and said fourth semiconductor layer; and
   (f) forming a conductive film on said insulative film.

20. A method of fabricating a semiconductor device having a high breakdown voltage and a low resistance as defined in claim 19, wherein said step (a) comprising the steps of:
   (a-1) forming a first conductivity type fifth semiconductor layer on said second semiconductor layer, the impurity concentration of said fifth semiconductor layer being lower than that of said second semiconductor layer;
   (a-2) selectively removing said fifth semiconductor layer to define the configuration of said fifth semiconductor layer such that the total cross-sectional area of said fifth semiconductor layer is decreased in said direction to form a concave portion with said first and fifth semiconductor layers; and
   (a-3) filling said concave portion with first conductive semiconductor material to form said first semiconductor layer, the impurity concentration of said material being equal to that of said first semiconductor layer.

21. A method of fabricating a semiconductor device having a high breakdown voltage and a low resistance as defined in claim 19, wherein said step (a) comprising the steps of:
   (a-1) selectively removing a first conductivity type semiconductor substrate to form said first semiconductor layer having a concave portion on said first major surface, the total cross-sectional area of said first semiconductor being increased in said direction; and
   (a-2) bonding a first conductivity type second semiconductor layer to said first semiconductor layer on said first major surface, the impurity concentration of the second semiconductor layer being higher than that of said first semiconductor layer.

* * * * *